(12) United States Patent
Tanioka et al.

(10) Patent No.: US 7,548,082 B2
(45) Date of Patent: Jun. 16, 2009

(54) INSPECTION PROBE

(75) Inventors: Michinobu Tanioka, Tokyo (JP); Atsuo Hattori, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/553,580

(22) PCT Filed: Apr. 15, 2004

(86) PCT No.: PCT/JP2004/005347

§ 371 (c)(1),
(2), (4) Date: Jun. 5, 2006

(87) PCT Pub. No.: WO2004/092749

PCT Pub. Date: Oct. 28, 2004

(65) Prior Publication Data

US 2006/0208752 A1     Sep. 21, 2006

(30) Foreign Application Priority Data

Apr. 15, 2003   (JP)  ............................. 2003-109843

(51) Int. Cl.
*G01R 31/02* (2006.01)
(52) U.S. Cl. ...................... 324/762; 324/754
(58) Field of Classification Search .......... 324/754–762
See application file for complete search history.

(56) References Cited

U.S. PATENT DOCUMENTS

| | | | | |
|---|---|---|---|---|
| 5,974,662 | A  * | 11/1999 | Eldridge et al. ............... | 29/842 |
| 6,255,126 | B1 * | 7/2001  | Mathieu et al. ............... | 438/15 |
| 6,344,752 | B1 * | 2/2002  | Hagihara et al. ............ | 324/754 |
| 6,747,465 | B2 * | 6/2004  | Esashi et al. ................ | 324/754 |
| 2001/0009376 | A1 * | 7/2001 | Takekoshi et al. ........... | 324/754 |

FOREIGN PATENT DOCUMENTS

| | | |
|---|---|---|
| JP | 5-198636 | 8/1993 |
| JP | 6-140482 | 5/1994 |
| JP | 6-324081 | 11/1994 |
| JP | 6-331655 | 12/1994 |
| JP | 6-334005 | 12/1994 |
| JP | 6-334006 | 12/1994 |
| JP | 8-15318 | 1/1996 |
| JP | 8-115955 | 5/1996 |
| JP | 10-38918 | 2/1998 |
| JP | 2002-257859 | 9/2002 |

* cited by examiner

*Primary Examiner*—Ha Tran T Nguyen
*Assistant Examiner*—Roberto Velez
(74) *Attorney, Agent, or Firm*—Scully, Scott, Murphy & Presser, P.C.

(57) ABSTRACT

A conventional inspection probe has posed such problems that, when a pitch is as fine as up to 40 μm, a positional accuracy is difficult to ensure depending on constituting materials and a production method, pin breaking occurs when fine-diameter pins contact, a good contact cannot be obtained due to an insufficient contact, an durability is insufficient. An inspection probe having a probe structure comprising an elastic probe pin, a wiring layer carrying substrate, a backup plate to install a substrate thereon, an inspection substrate and a flexible substrate, characterized in that a good-contact material layer according to the electrode material of a semiconductor device is formed at the tip end of a probe pin and a wiring layer has a structure formed of a low-resistance metal layer, with the good-contact material layer being separated from the low-resistance metal layer. Such a structure can provide very high contact reliability and mechanical durability at a pitch as very fine as up to 40 μm.

10 Claims, 15 Drawing Sheets

(A)

(B)

(C)

(A)

OBSERVED IN X DIRECTION (B)

OBSERVED IN Y DIRECTION

INSPECTION PROBE

TECHNICAL FIELD

The present invention relates to probes coming in contact with electrodes of LSI (Large Scale Integration), which are semiconductor devices, or electrodes of bare LSI (bare chips) and, in particular to a probe structure suitable for inspection of LSI and bare chips with a small electrode pitch, a method for coming into contact between a probe and a semiconductor device, and a method for inspecting a semiconductor device.

BACKGROUND ART

Inspection of Semiconductor devices have been conventionally carried out as described below. Probes of an inspection substrate are first made in contact with external terminal electrodes of a semiconductor device serving as an inspection target. Subsequently, the inspection substrate is electrically come in contact with the semiconductor device. Inspection of the semiconductor device is thereby carried out. Examples of the probes include a metal lead supported by a flexible substrate, a pin including a coated silicon whisker, a metal pin, or the like.

A first conventional example is a membrane sheet type with metal leads (TAB).

The first conventional example is described in, for example, Japanese Unexamined Patent Publication Nos. 6-334006, 6-334005, 6-331655, and 6-324081. These documents disclose probe structures which are methods of using flexible substrates having metal leads placed in positions opposed to external electrodes of the semiconductor device.

FIG. 1 typically shows a configuration of "a probe card" disclosed in Japanese Unexamined Patent Publication No. 6-334006. In FIG. 1, (A) is a sectional view showing a principal part of a side of the probe card and (B) is a perspective view showing the probe card partly in cross section.

The illustrated probe card has a structure so that a flexible film 23 having a desired inspection circuit pattern and probe pins 3 on a face thereof and that the probe pins 3 come into contact with external electrodes of a semiconductor device 1. The probe pins 3 are arranged at end portions of wiring patterns (not shown), which are supported on the film 23. The wiring patterns, the probe pins 3, and the film 23 integrally form a flexible printed circuit (FPC) 6. Inasmuch as the flexible printed circuit 6 is thin, it is therefore cannot provide a desired contact force discretely. Accordingly, the probe card includes dampers 25 and supporting bodies 29 for supporting the flexible printed circuit 6 at both sides thereof. Therefore, it adopts, as the probe pins 3, structures enable to obtain desired contact.

The supporting bodies 29 are made of stainless steel or brass. The supporting bodies 29 each have a sloped surface, located on the front side (the right side in FIG. 1(A)) thereof, for supporting a portion of the flexible printed circuit 6 that is close to the probe pins 3 and also have a horizontal mounted surface, located on the rear side (the left side in FIG. 1(A)) thereof, for fixing each card substrate. The sloped surface has a trapezoidal shape when viewed from above (see FIG. 1(B)).

The probe card further comprises hard reinforcement plates 28 made of stainless steel and printed circuit boards 27 having wiring patterns on the upper surfaces thereof. The printed circuit boards 27 are reinforced by the reinforcement plates 28 to form a hard card substrate. The dampers 25 each comprises a trapezoidal plate having a short side located on the front side thereof (see FIG. 1(B)). The dampers 25 are fixed above the supporting bodies 29 with bolts 26 in such a manner that insulating sheets 24, the flexible printed circuit 6, and the campers are stacked on the sloped surfaces of the supporting bodies 29 in that order (see FIG. 1(A)). In this configuration, portions of the flexible printed circuit 6 that are close to the probe pins 3 are fixed on the sloped surfaces of the supporting bodies 29 upwards and entire end portions thereof support the probe pins 3 upwards.

A second conventional example is a type using silicon whiskers. The second conventional example is described in, for example, Japanese Unexamined Patent Publication Nos. 10-038918, 2002-257859, and 5-198636.

FIG. 2 typically shows a configuration of "probe pins and a contactor including the same" disclosed in Japanese Unexamined Patent Publication No. 10-038918.

The illustrated probe pin is probe structure of the type which includes a probe pin 3 having structure where a Ni base layer 32 and an Au layer 33 are formed on one grown with a whiskered silicon monocrystal 31 and a Pd layer 34 is formed to the tip thereof. The whiskered silicon monocrystal 31 can be formed in such a manner that an Au seed is disposed on a silicon substrate 30 and then grown by a VLS process. The illustrated probe pin is a probe where a conductive layer is placed on a surface thereof, are used to measure semiconductor devices, and have a probe pin structure in which the tips thereof are covered with a contact material.

A third conventional example is a type using metal pins. The third conventional example is described in, for example, Japanese Unexamined Patent Publication-No. 6-140482.

FIG. 3 shows a configuration of "a probing device" disclosed in Japanese Unexamined Patent Publication No. 6-140482. In FIG. 3, (A) is a perspective view for use in describing a principal part of the probing device and (B) is a sectional view for use in describing a principal part of the probing device.

The illustrated probing device has a probing structure where quartz probe pins 38 and wire probe pins 35 prepared by processing metal pins containing tungsten or the like into fine wires are used together and a structure where the pitch of these pins is small and the probing device can come down in cost.

As shown in FIG. 3, the tungsten wire probe pins 35 are attached to a printed substrate 27 so as to correspond electrodes of a semiconductor device that are arranged at a large pitch (a pitch of 300 to 400 μm) and the quartz probe pins 38 are attached to the printed substrate so as to correspond electrodes of the semiconductor device that are arranged at a small pitch (a pitch of 45 to 65 μm). The quartz probe pins 38 are prepared in such a manner that a tip portion of a quartz sheet 36 is etched and an electrode pattern is formed by plating a surface of the quartz sheet 36 with gold. The quartz probe pins 38 can be used to inspect fine-pitch electrodes, for example, 40 μm pitch electrodes. Inasmuch as the probing device includes the different probe pins separately used depending on the electrode pitch, the probing device can come down in cost as compared to other probing devices including no pins other than quartz probe pins.

The printed substrate 27 has an observation window 37 located at the center thereof. Pattern wires placed on a flexible substrate 6 are electrically connected to contact pins 39 of the printed substrate 27.

However, the first to the third conventional examples have problems below.

Inasmuch as the first conventional example uses, as the base, the film-like flexible material, this example has problems below.

(I-1) It is difficult to control the positional accuracy of the metal leads arranged at a small pitch less than or equal to 40

μm within a desired value (±1.0 μm or less) in a pitch direction because of the thermal history during the manufacture of the film substrate.

(I-2) If a wafer is inspected at a high temperature of 80° C. to 100° C., the metal leads are misaligned with electrodes of semiconductor devices because a film material has a thermal expansion coefficient (several tens ppm) greater than the thermal expansion coefficient (2 to 3 ppm) of silicon as material of the semiconductor devices.

Inasmuch as the probe pins used in the first conventional example are made of a single elastic metal material that has not been selected depending on a material of a contact target, this example further has a problem below.

(I-3) It is difficult to obtain good contact properties in some cases.

Inasmuch as the second conventional example has structure where the pin including the coated whiskered silicon monocrystal make contact with the external electrode of the semiconductor device, the second conventional example has problems below.

It is assumed that pins with a diameter of about 10 μm are formed so as to match electrodes arranged at a pitch of 40 μm or less, for example, a pitch of 20 μm. In this case, it is very difficult to provide gold bumps on Si mesas before growing pins, a stress is created during the formation of a metal layer, and damage is caused in a process of trimming the tips after forming the pins, Therefore, there are problems below.

(II-1) It is difficult to secure the positional accuracy to cope with the electrode pitch of the semiconductor devices.

(II-2) Inasmuch as the diameter of the pins is very small, the pins are broken by overdriving because the strength of the pins is low.

Inasmuch as the Si pins used in the second conventional example are entirely covered with metal layers in order to obtain conductivity and the tips of the Si pins have metal films thereon, this example further has a problem below.

(II-3) The cost thereof is high.

The third conventional example has structure where the tungsten wire probe pins and the quartz probe pins making contact with the external electrodes of the semiconductor devices are separately used depending on the electrode pitch. In order to inspect electrodes arranged at a small pitch, for example, a pitch of 40 μm or less, the wire probe pins must have a diameter of 20 μm or less; hence, this example has a problem below.

(III-1) It is very difficult in manufacture. If possible, it is very difficult to arrange the pins with high accuracy. Furthermore, there is a problem in that the pins have low strength.

The third conventional example further has problems, as described below, due to the stress created by forming the metal layers on the quartz probe pins as well as the silicon probe pins of the second conventional example.

(III-2) It is difficult to secure the positional accuracy to cope with the electrode pitch of the semiconductor devices.

(III-3) Inasmuch as the diameter of the pins is very small, the pins are broken by overdriving because the strength of the pins is low.

In a case where the third conventional example includes no pins other than the quartz probe pins, this example further has a problem below.

(III-4) The cost thereof is high.

Furthermore, even if the pins are used such that that the pins are not broken by overdriving, the second and third conventional examples have a common problem below.

(III-5) It is impossible to secure the durability of the pins for practical use.

Accordingly, it is an object of the present invention to provide a practical inspection probe useful in inspecting semiconductor devices with a small electrode pitch.

DISCLOSURE OF INVENTION

An inspection probe according to the present invention is an inspection probe comprising probe pins coming in contact with external terminal electrodes of a semiconductor device serving as an inspected substance, a base member having wiring layers for expanding the pitch of the electrodes, a backup plate for mounting the base member thereon, an inspection substrate, and a flexible substrate wherein material layers, which are selected depending on a material of the electrodes of the semiconductor device, having good contact properties are formed at the tips of the probe pins and low-resistivity metal layers are placed on the wiring layers.

BEST MODE FOR CARRYING OUT THE INVENTION

Embodiments of the present invention will now be described in detail with reference to the accompanying drawings.

First Embodiment

Figure 4:
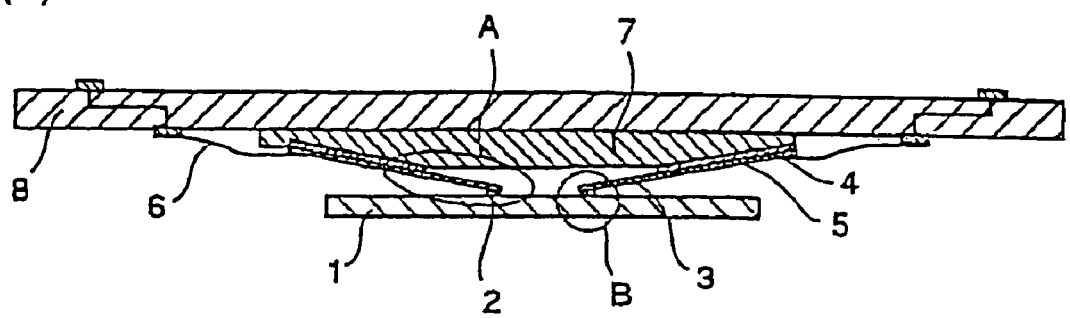
FIG. 4(A) is a sectional view showing an inspection probe according to a first embodiment of the present invention.
FIG. 4(B) is a plan view showing the inspection probe.
FIG. 4(C) is an enlarged plan view showing a square section shown in FIG. 4(B).
Figure 4:
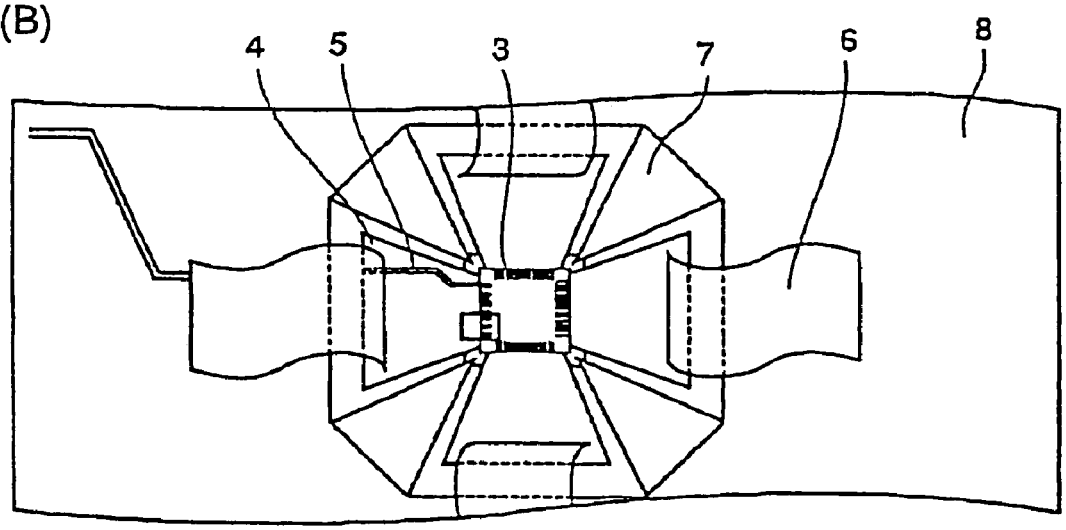
Figure 4:
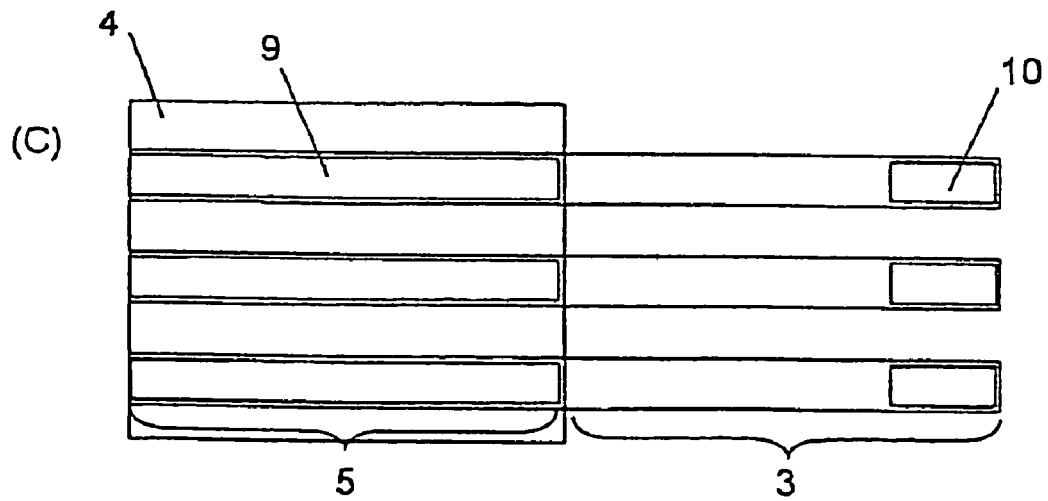
Figure 5:
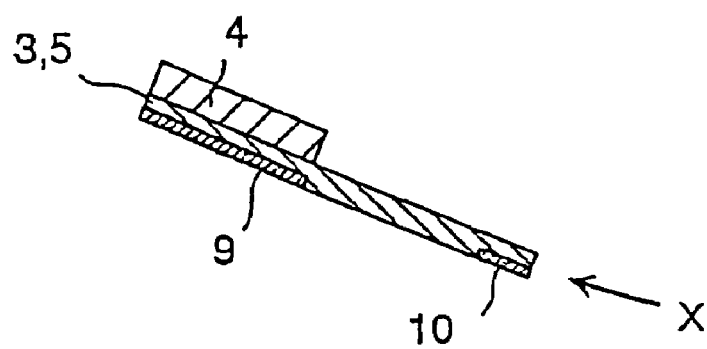
FIG. 5 is a detailed sectional view showing the structure of a probe tip in a probe section and a configuration of a wiring layer, the structure and the configuration being shown in such a manner that Area A in FIG. 4(A) is enlarged; (A) is an illustration showing a first configuration and (B) is an illustration showing a second configuration.
Figure 5:
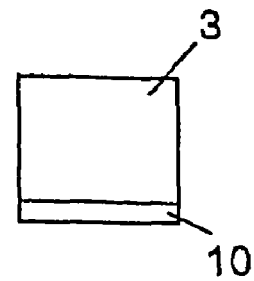
Figure 5:
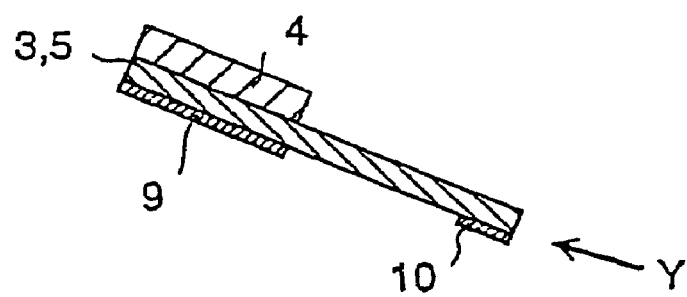
Figure 5:
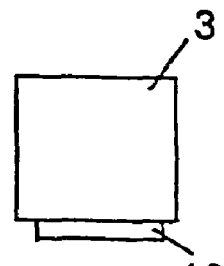

FIG. 4(A) is a sectional view of a probe structure according to a first embodiment of the present invention, FIG. 4(B) is a plan view of the probe structure, and FIG. 4(C) is an enlarged plan view of a probe pin section. FIG. 5 is a detailed sectional view of the probe pin section which is shown in such a manner that Area A in FIG. 4 is enlarged.

As shown in FIGS. 4 and 5, the probe structure of the first embodiment comprises probe pins 3 coming in contact with external terminal electrodes 2 of a semiconductor device 1 serving as an inspected substance, wiring layers 5 for expanding the pitch of the electrodes, base members 4 holding the wiring layers, a backup plate 7 for mounting the base members 4 thereon, an inspection substrate 8, and flexible printed circuits (FPCs) 6 made of polyimide. In order to prevent the positional accuracy of the pins from being reduced due to the thermal history during the manufacture of the probe and in order to prevent the probe pins from being misaligned with semiconductor electrodes during the inspection of a wafer at high temperature, the base members 4 are made of a material, such as glass ceramic, glass, or silicon, having a thermal expansion coefficient close to that of silicon, which is a semiconductor material widely used. Among these materials, the glass ceramic is preferably used in view of its processability and electrical properties.

The probe pins 3 are elastic and are separately arranged so as to form an angle of 0 to 45 degrees with a face of the semiconductor device 1 on which the external terminal electrodes 2 are formed. An elastic material preferably has a Young's modulus of 100 GPa or more and more preferably 150 to 250 GPa because of the relationship between the Young's modulus of the probe pins and the pressure applied to the probe pins touching the electrodes of the semiconductor device. The wiring layers 5 are electrically connected to the probe pins 3. The FPCs 6 are for deriving the wiring layers 5 to the inspection substrate 8. The backup plate 7 is mounted on the inspection substrate 8.

Arrangements of the probe pins 3 and the wiring layers 5 placed on the base members 4 will now be described with reference to FIG. 5. In FIG. 5, (A) shows a first arrangement and (B) shows a second arrangement.

The probe pins and the wiring layers are simultaneously formed, on the base members by an electroplating process, by processing metal layers (for example, nickel, nickel-iron alloy, nickel-cobalt alloy, or nickel-manganese alloy) having a Young's modulus of 100 GPa or more. The probe pins have the greatest width of 10 μm such that no short circuit occurs during the inspection of electrodes arranged at a pitch of 20 μm. The probe pins and the wiring layers have a thickness of 10 μm, which is the maximum obtained in one plating process. The probe pin portions extend from the base members. The probe pin portions preferably have a small length and have a length of 400 μm in particular. This length is determined based on the elastic limit of the probe pins to which an overdrive of 70 μm is applied, wherein the overdrive corresponds to the distance that semiconductor electrodes serving as inspected substances are moved upward from their initial positions after the semiconductor electrodes come in contact with the tips of the probe pins, that is, the distance that the probe pins are pressed. Subsequently, low-resistivity metal layers 9 (for example, gold, gold-palladium alloy, or gold-copper alloy) having a volume resistivity of $1 \times 10^{-8}$ to $4 \times 10^{-8}$ Ω·m are formed on regions of the wiring layers other than regions having the probe pins thereon by a electroplating process or a sputtering process so as to prevent transmission properties of signals from being degraded due to conductor loss, the volume resistivity thereof being less than that of Ni or a Ni alloy used to prepare the wiring layers. The regions having the low-resistivity metal layers thereon have a width of 8 μm and extend on the wiring layers 5 from positions which are located close to the base members and which are the manufacturing tolerance of 1 μm apart from the boundaries between the roots of the probe pins and the base members.

Thereafter, metal layers 10 (for example, gold alloy) are formed on regions of the probe pins by a plating process or a sputtering process, the regions being located close to the tips of the probe pins and located on faces of the probe pins that come in contact with the semiconductor electrodes. The metal layers located close to the tips of the probe pins and the low-resistivity metal layers placed on the wiring layers can be simultaneously formed if these layers are made of the same material. This leads to a reduction in the number of manufacturing steps, resulting in a reduction in manufacturing cost.

Regions, located close to the tips, having the metal layers 10 have a size as described below. It is assumed that a contact target has an electrode pitch of 20 μm and an electrode size of 12 μm, an inspection probe forms a contact angle of 15 degrees with respect to a face having semiconductor electrodes thereon, and the overdrive (the distance that the semiconductor electrodes serving as inspected substances are moved upward from their initial positions after the semiconductor electrodes come in contact with the tips of probe pins, that is, the distance that the probe pins are pressed) is 70 μm. In this case, the regions, located close to tips of the probe pins 3, having the metal layers 10 need to have a length, in a longitudinal direction, greater than the sum of the amount of scrubbing (the distance that the probe pin tips are moved in such a manner that the tips are rubbed against the electrodes because of the overdrive, the distance being equal to 14 μm), the electrode size (12 μm), the longitudinal positional tolerance (±5 μm) of the probe pins 3, and the positional tolerance (±1 μm) of the electrodes 2 of the semiconductor device 1, that is, the probe pins 3 need to have a length of 38 μm or more. The regions, located close to the tips, having the metal layers 10 need to have a width greater than or equal to half of the width of the probe pins 3. The necessary length in the longitudinal direction is as described below.

Figure 6:
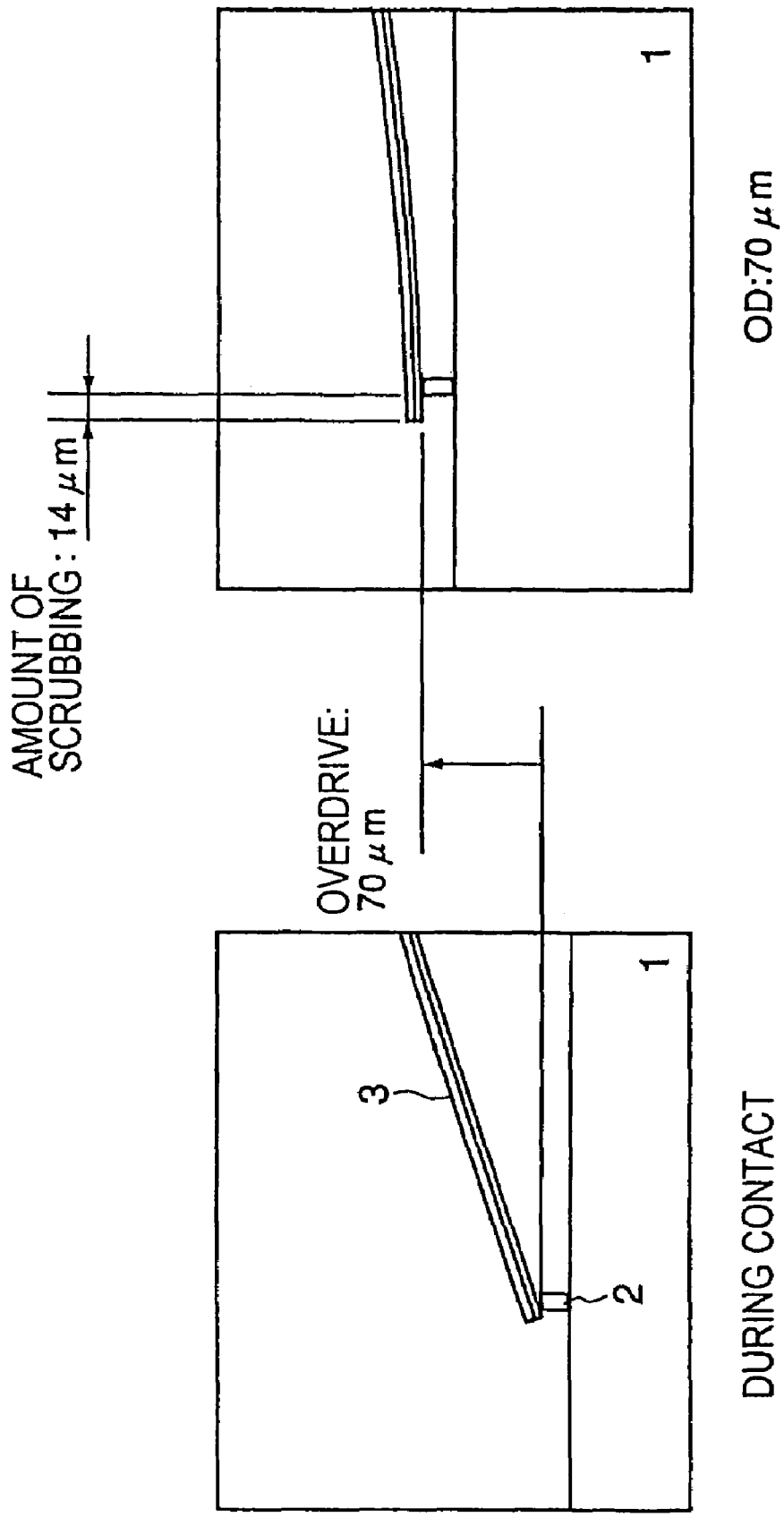
FIG. 6 is an illustration showing a probing state observed in the lateral direction and also showing the amount of overdrive and the amount of scrubbing.

FIG. 6 is a side view illustrating contacts, the electrodes 2 of the semiconductor device 1, and the probe pins 3 to which an overdrive of 70 μm is applied.

As is clear from FIG. 6, the amount of scrubbing is defined as the distance that the probe pins 3 coming in contact with the electrodes 2 are moved in such a manner that the probe pins 3 are rubbed against the electrodes. The electrode size is equal to that of portions that come in contact with the probe pins 3 at the point of time when overdriving (inspection) is finished. In order to keep the relationship between the initial positions of the electrodes 2 and the initial positions of the probe pins 3, the longitudinal positional tolerance of the probe pins 3 and the positional tolerance of the electrodes must be taken into consideration. In view of the longitudinal positional accuracy of the probe pins 3, portions of the probe pins may extend beyond the electrodes at the beginning such that the extending portions thereof have a length equal to about half (6 µm) of that of the electrodes.

A material for forming the metal layers 10 of the tip portions of the probe pins and a material for forming the low-resistivity metal layers 9 formed on the wiring layers on the base member may be homogeneous or heterogeneous from each other. If the electrodes of the semiconductor device are made of gold, the metal layers 10 formed on the probe tips may be made of gold and the low-resistivity metal layers 9 may be made of gold. In this case, inasmuch as the metal layers 10 of the tip portions of the probe pins and the low-resistivity metal layers 9 on the wiring layers can be simultaneously formed, the number of manufacturing steps can be reduced, whereby the manufacturing cost can be reduced. Alternatively, the metal layers 10 formed on the probe tips may be made of a gold alloy, palladium, or rhodium and the low-resistivity metal layers 9 may be made of gold. Inasmuch as the probe pins are repeatedly used, the metal layers formed on the probe pin tips can be peeled off from the probe pins during continuous probing in some cases if the metal layers formed on the probe tips have a hardness less than or equal to that of the electrodes of the semiconductor device. In order to allow the probe pins to have long-term reliability by preventing such a problem, the metal layers 10 formed on the probe tips are preferably made of a material having a hardness greater than that of the external terminal electrodes 2 of the semiconductor device 1. However, if the probe pins are not frequently used, the metal layers 10 and the low-resistivity metal layers 9 may be made of the homogeneous material (for example, gold).

An advantage in that the metal layers 10 on the tip portions of the probe pins are spaced from the low-resistivity metal layers 9 on the wiring layers will now be described using experiment results.

Figure 7:
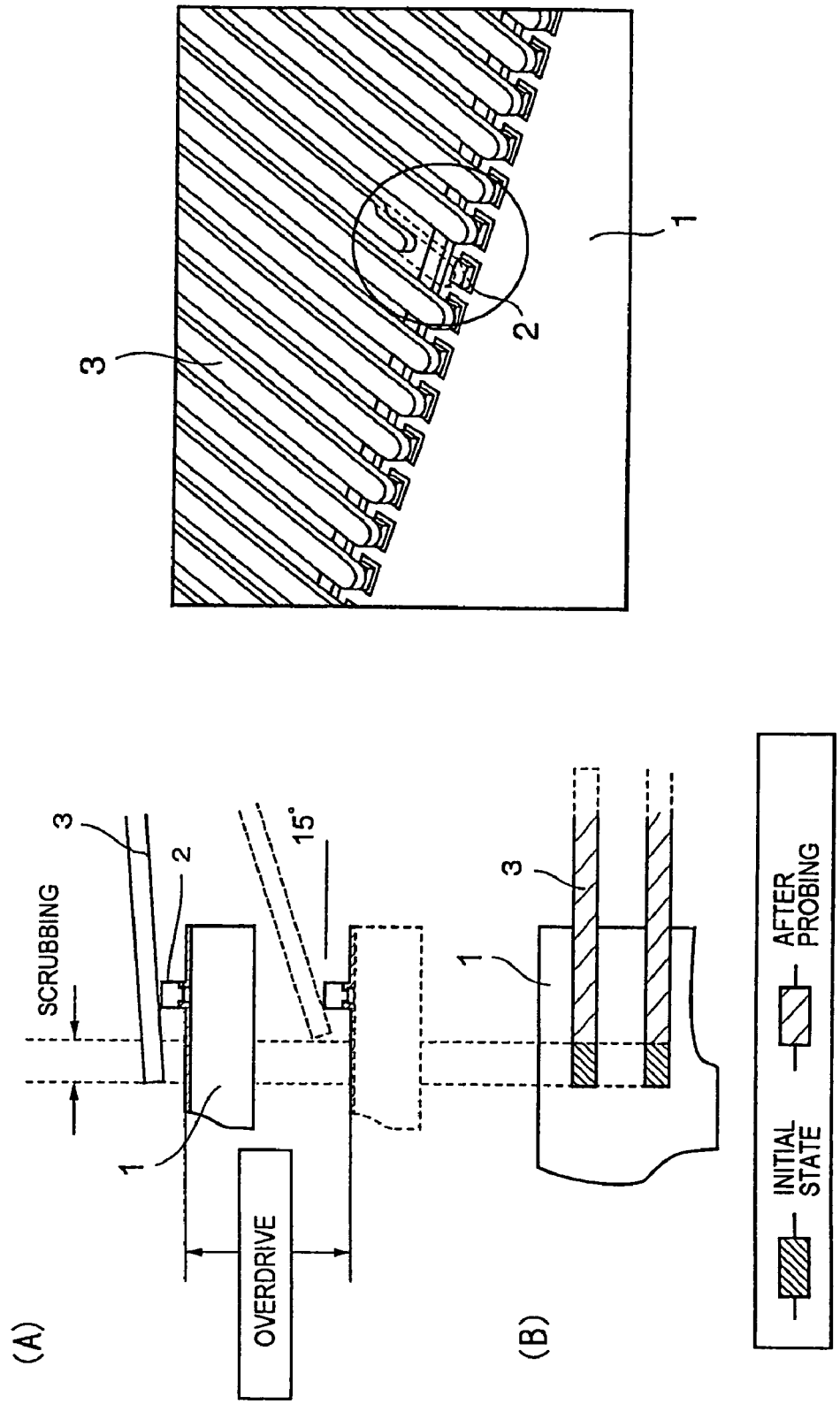
FIG. 7 is a schematic view showing probing in such a manner that Area B in FIG. 4(A) is enlarged; (A) is a side view, (B) is a plan veiw, and (C) is a perspective view.

The mechanism of probing is first described with reference to FIG. 7, which is a schematic view illustrating probing. FIG. 7(A), 7(B), and 7(C) are a side view, a plan view, and a perspective view, respectively, of the probe pins, unused or used in probing, coming in contact with metal bump electrodes 2 as contact targets. In a circle shown in FIG. 7(C), in order to observe the shape of the electrodes, the tip of one of the pins is omitted.

The probe pins 3 are elastically deformed themselves by overdriving and the metal bump electrodes 2 are therefore scrubbed with the pins, whereby electrical contact is established therebetween.

FIGS. 9(A), 9(B), and 9(C) show mechanical properties of three types of probe pins shown in FIGS. 8(A), 8(B), and 8(C), respectively. These probe pins are included in probe structures that come in contact with gold bump electrodes of semiconductor devices according to the same mechanism as above. The probe structures each have one of the following configurations: a configuration in which metal layers lie over the probe pins and wiring layers as shown in FIG. 8(A), a configuration in which a base material for forming the probe pins and wiring layers are arranged as shown in FIG. 8(B), and a configuration in which metal layers are placed close to the tips of the probe pins and other metal layers are placed on wiring layers as shown in FIG. 8(C).

Figure 8:
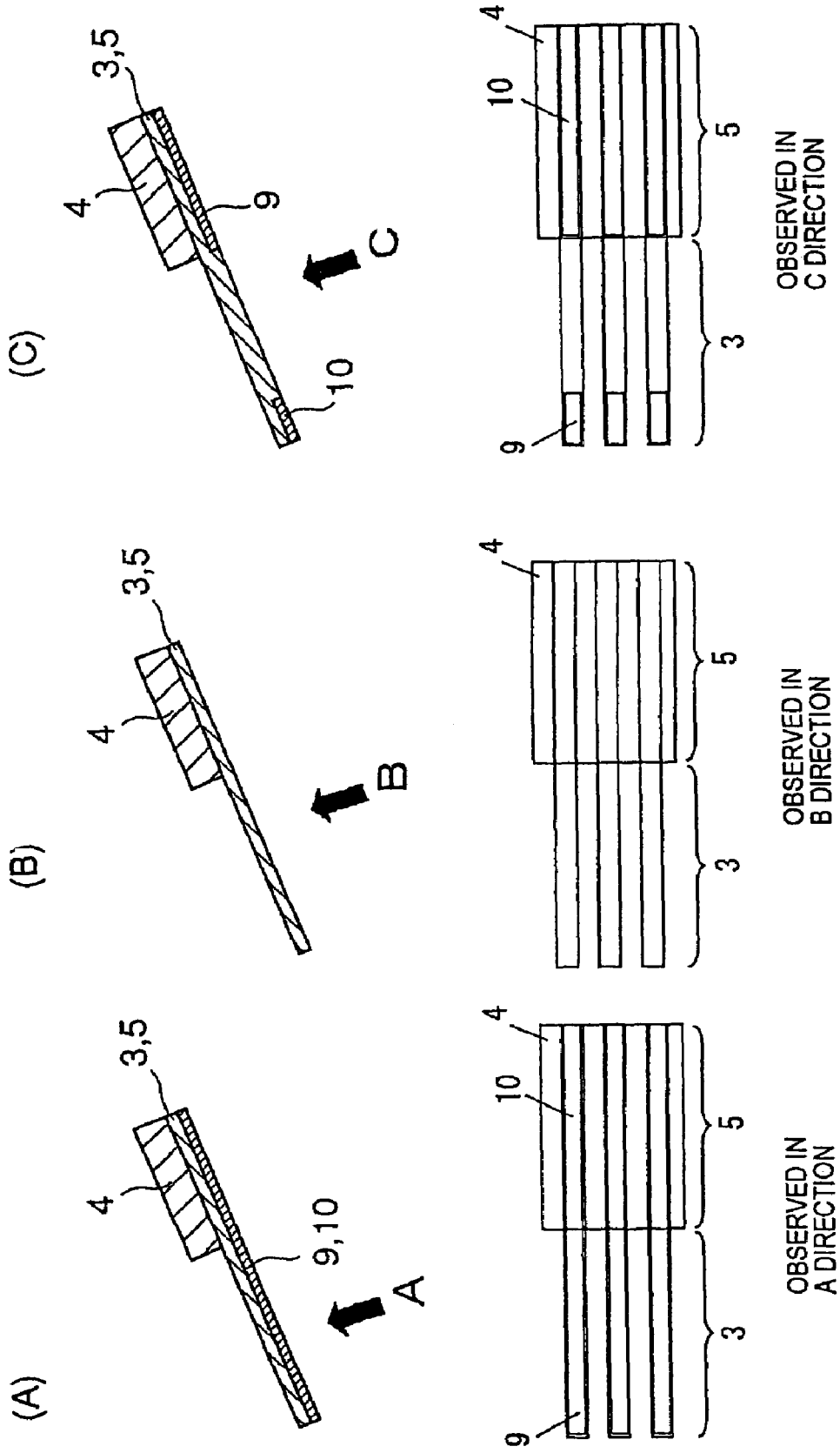
FIGS. 8(A), 8(B), and 8(C) are sectional views showing three types of probe pins.

The structure of the probe pins is described in detail with reference to FIG. 8. FIG. 8(B) shows the probe pins which are made of a single elastic metal and which have a width of 10 µm, a thickness of 10 µm, and a length of 400 µm. FIG. 8(A) shows the probe pins which have the same size as that of the probe shown in FIG. 8(B) and which have gold alloy layers formed by a plating process. The gold alloy layers are placed on faces of the probe pins that come in contact with the electrodes of the semiconductor device, extend from the tips of the probe pins to the roots thereof, and have a width of 8 µm and a thickness of 2 µm. FIG. 8(C) shows the probe pins which have the same size as that of the probe pins shown in FIG. 8(B) and which have gold alloy layers, extending from the tips thereof, having a length of 100 µm, a width of 8 µm, and a thickness of 2 µm. The probe pins shown in FIG. 8(C) have the probe structure of the present invention.

Figure 9:
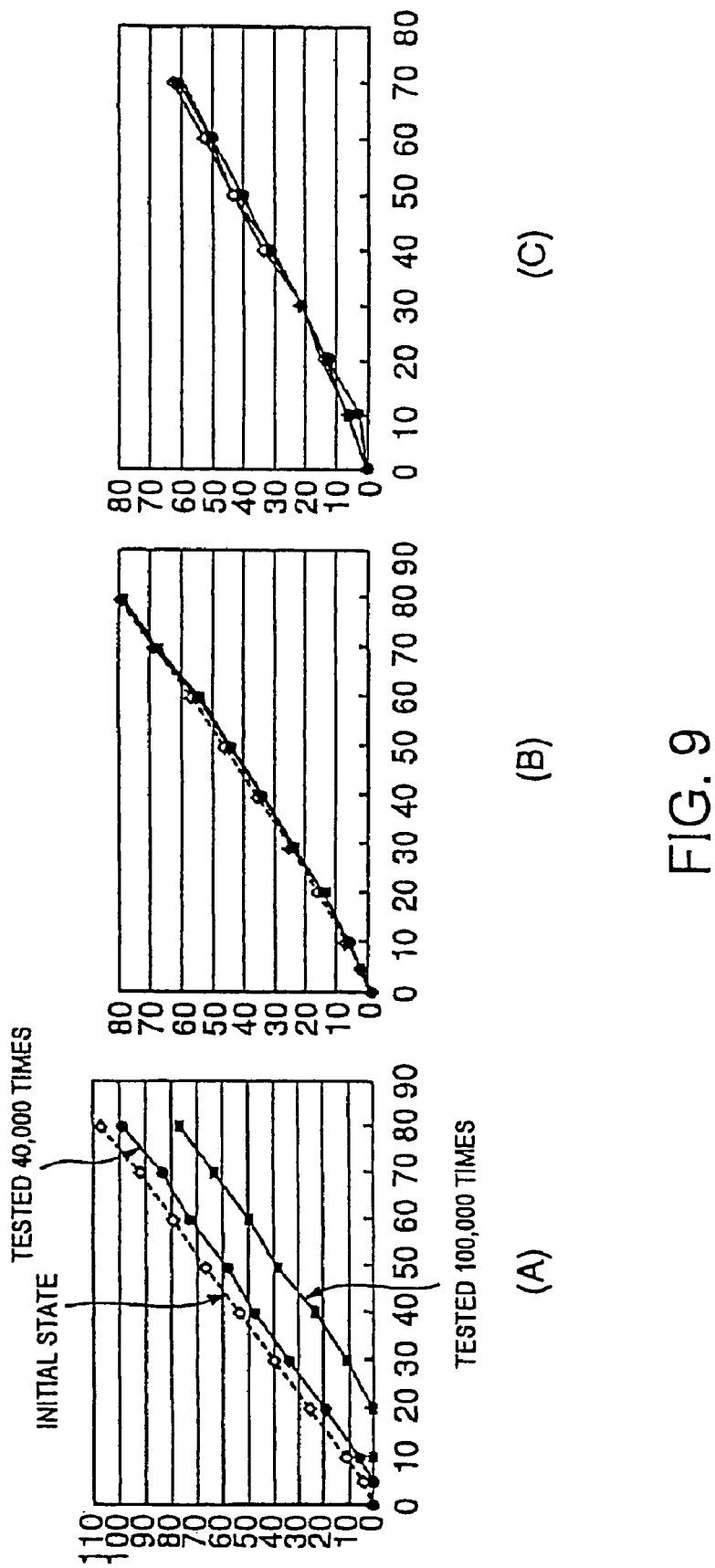
FIGS. 9(A), 9(B), and 9(C) are graphs showing evaluated results of the durability of probe pins.

In FIG. 9, the ordinate represents the overdrive (µm) and the abscissa represents the load (mg/pin).

FIG. 9 shows measured results of the relationship between the load applied to the probe pins and the number of times that a predetermined overdrive was repeatedly applied to the probe pins. As is clear from FIG. 9(A), inasmuch as the metal layers are formed over the probe pins and the wiring layers, the probe pins do not return to their original state after an overdrive is applied to the probe pins 1,000 times. The probe pins to which an overdrive is applied one hundred thousand times have a deformation of 20 µm. That is, the gold alloy layers are plastically deformed by the stress applied to the roots of the probe pins during probing, whereby it may be estimated that the probe pins are probably deformed because of this influence. In contrast, the other probe pins are hardly deformed because a change in load is small.

Figure 10:
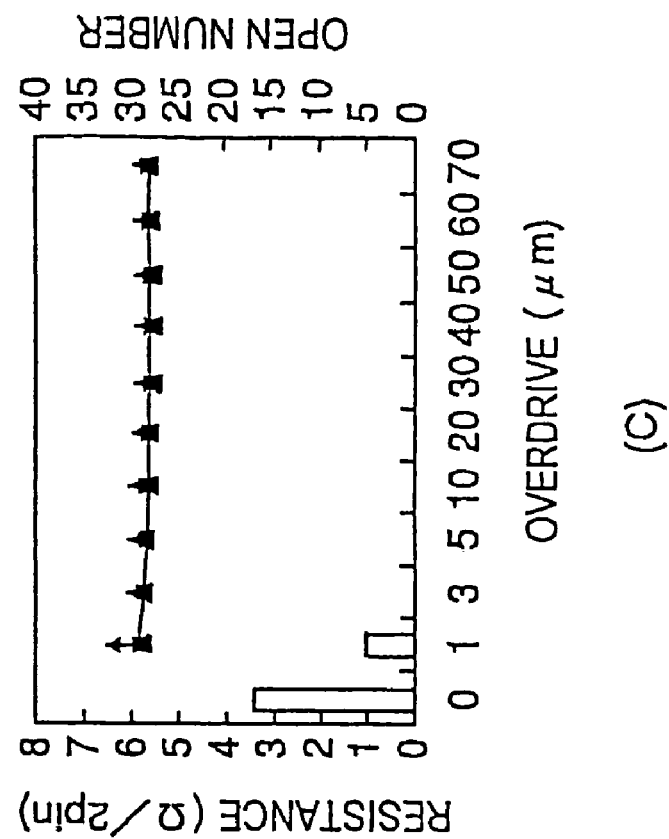
FIGS. 10(B) and 10(C) are graphs showing measured results of contact properties.
Figure 10:
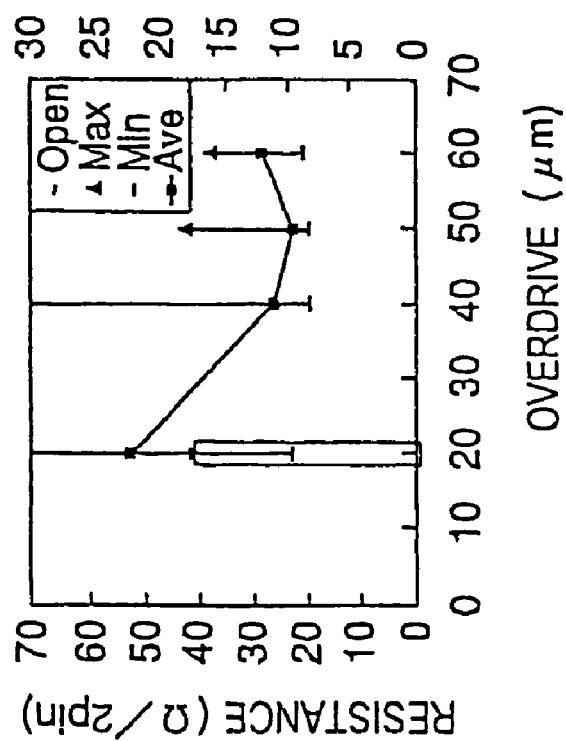

FIGS. 10(B) and 10(C) show contact properties of the two types of probe pins in which a change in load is small after probing is repeatedly performed. In FIG. 10, (B) shows contact properties of the probe pins made of the single elastic metal and (C) shows contact properties of the probe pins according to the present invention. In FIG. 10, the ordinate represents the resistance (Ω/2 pins) and the abscissa represents the overdrive (µm).

Figure 1:
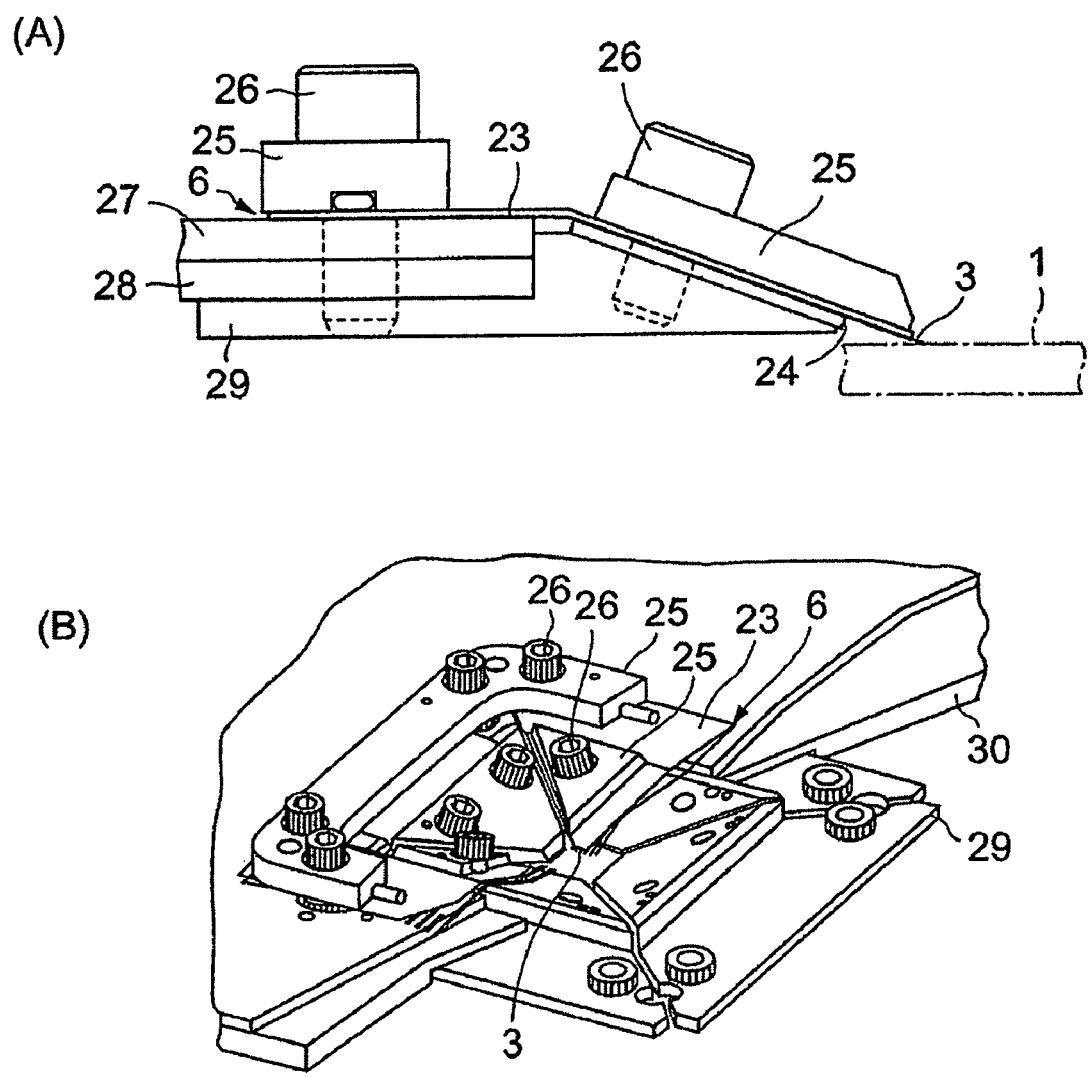
FIG. 1 is a view showing a first conventional inspection probe wherein (A) is a sectional view showing a principal part of a side thereof and (B) is a perspective view showing the probe partly in cross section.
Figure 2:
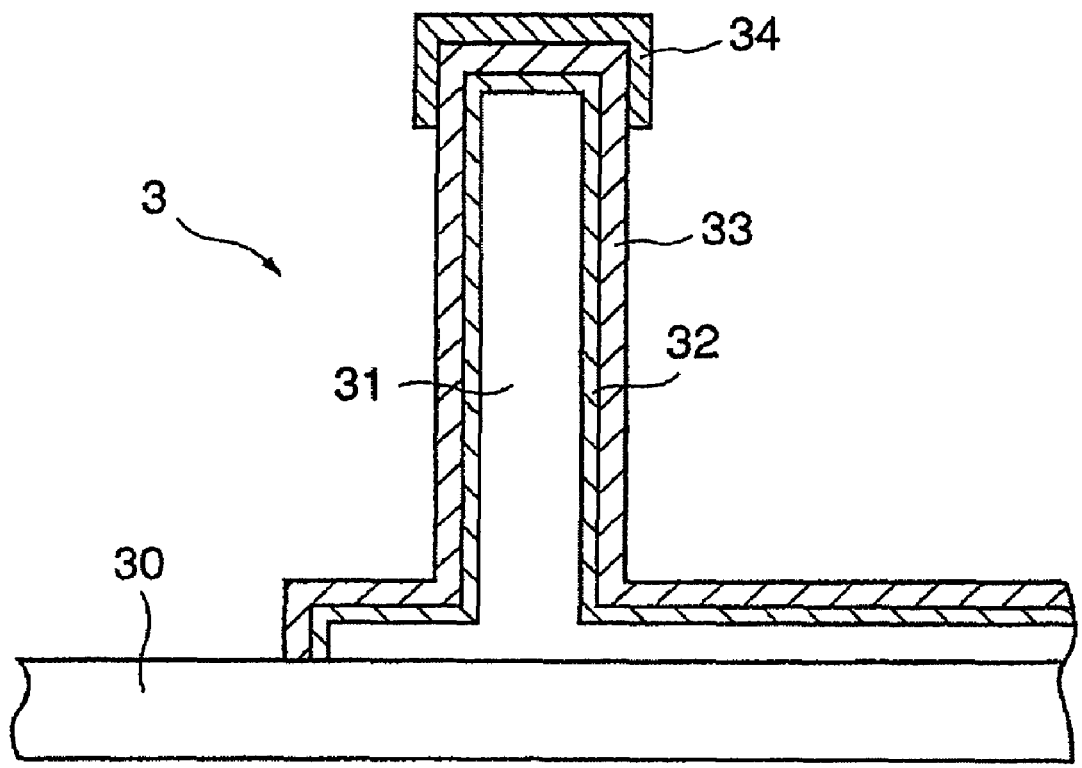
FIG. 2 is a sectional view showing a second conventional inspection probe.
Figure 3:
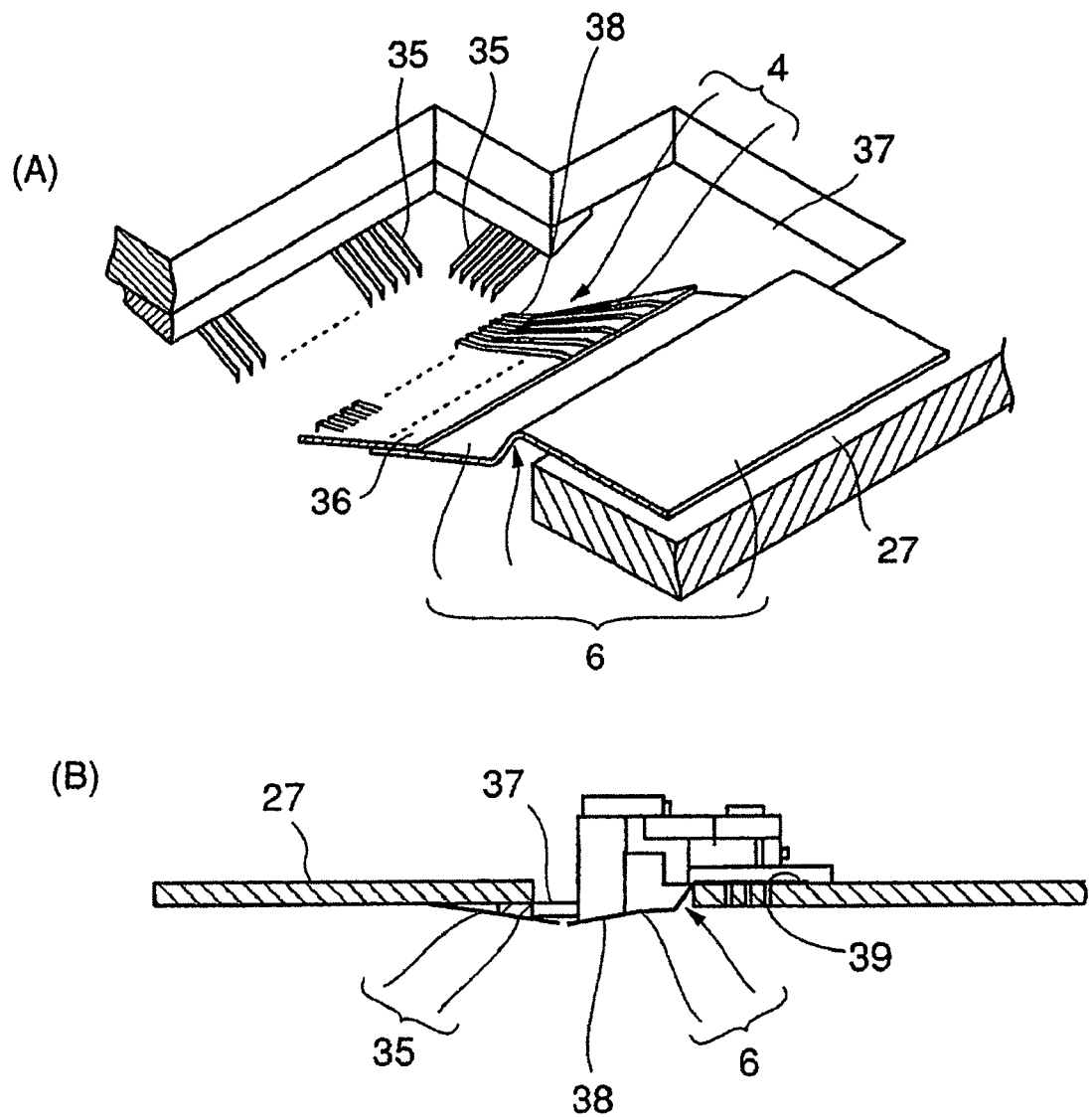
FIG. 3 is a view showing a third conventional inspection probe wherein (A) is a perspective view for use in describing a principal part thereof and (B) is a sectional view for use in describing the principal part.

As is clear from FIG. 10, the probe pins having the gold alloy plated layers located close to the tips thereof have a small difference in contact resistance, that is, these probe pins have a good contact property. Inasmuch as the gold alloy plated layers located close to the tips of the probe pins are spaced from the metal layers placed on the wiring layers, these probe pins have portions exposed from the metal layers; hence, there is apprehension that the exposed portions have high conductor loss. However, as is clear from FIG. 10, the exposed portions actually have a negligibly small conductor loss because the length of the exposed portions is sufficiently smaller than that of the wiring layers as shown in FIG. 1.

As is clear from the above experiment results, inasmuch as the probe pins 3 have the metal layers 10 located close to the tips acting as electric contacts and the metal layers 10 are spaced from the low-resistivity metal layers 5 placed on the wiring layers 5 on the base members 4, good contact properties and high durability can be achieved. Thus, it is quite advantageous that the metal layers 10 located closed to the tip portions of the probe pins 3 are spaced from the low-resistivity metal layers 5 on the wiring layers 5.

There are three principal reasons why the inspection probe of the present invention can cope with an electrode pitch of 40 µm or less. The first one is that the base members are made of a material, such as glass ceramic, glass, or silicon, having a thermal expansion coefficient less than that of a PI (polyimide film) and the accuracy can therefore be prevented from being reduced due to the thermal history during the manufacture thereof. The second one is that the pins can be formed by an electrocasting process so as to have a very small width and a uniform thickness and a sufficient contact pressure can therefore be applied to the pins. For example, the pins can be formed so as to have a width of 10 µm and a thickness of 10

µm. The third one is that the probe pins and the wiring layers placed on the base members can be formed by an additive process by applying a micromachine technique. Details are described in a subsequent item of a manufacturing method.

Second Embodiment

FIG. 11(A) is a sectional view showing a configuration of an inspection probe according to a second embodiment of the present invention and FIG. 11(B) is a plan view showing the configuration thereof.

In the inspection probe according to the first embodiment of the present invention, the four base members must be assembled with high accuracy when the structure body shown in FIG. 4 is prepared and the backup plate 7 must have high accuracy.

The contact reliability can be enhanced and the structure body of the first embodiment can be readily prepared by using a structure described in the second embodiment of this invention. Furthermore, the accuracy of the backup plate 7 may be low and the cost can be reduced. The tips of probe pins and low-resistivity metal layers are naturally identical to those described in the first embodiment. Differences in configuration between the inspection probes of the first and second embodiments will now be described.

A base member has material made of glass ceramic and the base member 4 is ground from the rear surface opposed to a surface on which the probe pins and the wiring layers are formed such that the base member has a thickness of about 100 µm. In order to remove altered layers, the base member may be subjected to dry etching depending on the condition of the ground face. When the base member has a thickness of 200 µm or more, the base member cannot be readily bent in a step of attaching the base member to a backup plate. When the base member has a thickness of 50 µm or less, the base member is cracked in the grinding step or the step of attaching the base member to the backup plate. Therefore, the thickness of the base member preferably ranges 75 to 175 µm and is most preferably about 100 µm, which is less than the middle of the range, in view of the bendability. In order to secure the rigidity of outer end portions of the probe base member 4, the probe base member 4 is joined to a support substrate 14 with an adhesive member 13 placed therebetween. The support substrate is made of the same material (glass ceramic, glass, or silicon) as that of the probe base member 4 and has a thickness of 600 µm or more. The resulting probe base member is mounted on an inspection substrate 8. The inspection substrate 8 has a protrusive support body (backup plate) 7 at a center area thereof and end faces thereof are used as supports. Since the probe base member 4 is bent at its portions in contact with ends of the support, the probe pins 3 each form a desired angle with respect to a electrode formed face of a semiconductor device 1.

The inspection probe of the second embodiment of this invention is different from that of the first embodiment of this invention in that the probe pins 3 are formed at four sides in one step and then mounted on this inspection substrate 8. It is therefore possible to heighten positional accuracy of the probe pins 3 after assembled and it is therefore to improve contact reliability thereof. The probe base members 4 are detachably fixed to the inspection substrate 8 with screws or positioning pins such that the probe pins can be removed from the inspection substrate together with the probe base member 4 if the probe pins 3 are damaged.

Figure 11:
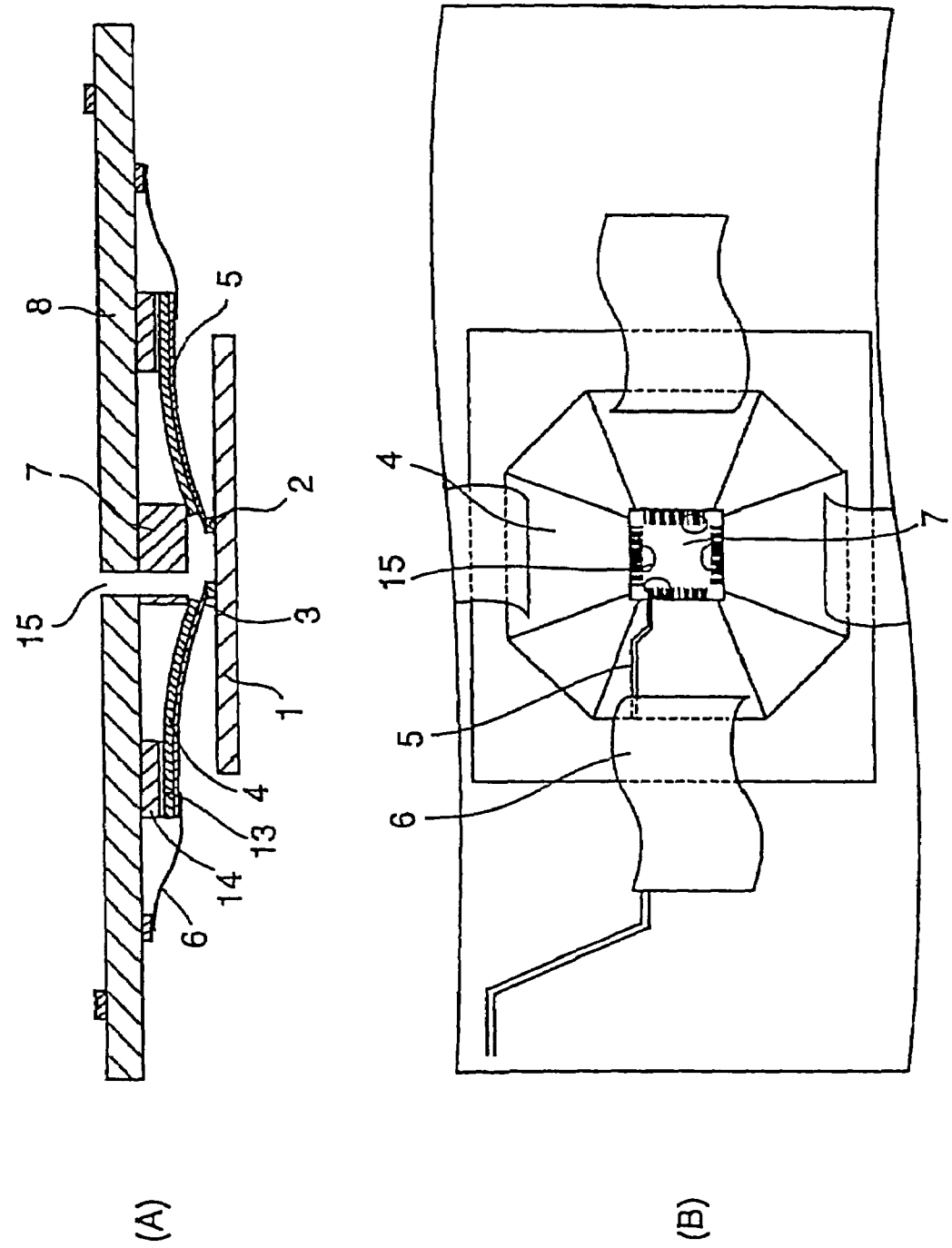
FIG. 11(A) is a sectional view showing an inspection probe according to a second embodiment of the present invention and FIG. 11(B) is a plan view showing the inspection probe.

As shown in FIG. 11, perforations 15 extend through the inspection substrate 8 and the protrusive support body (backup plate) 7. If the structure of the second embodiment is attached to a probe and a camera is provided above the structure, the condition of contact between the probe pins 3 and the electrodes 2 of the semiconductor device 1 can be observed through the perforations 15. The perforation 15 may be one in number such a size that the probe pins 3 and the electrodes 2 of the semiconductor device 1 can be observed. In order to observe the positions of the probe pins 3 and the electrodes 2 in the X, Y, and θ directions, additional perforations are preferably each arranged at corresponding sides.

After the inspection probe is attached to the probe, alignment can be readily performed using the perforations 15; hence, the time for preparation can be reduced.

Figure 12:
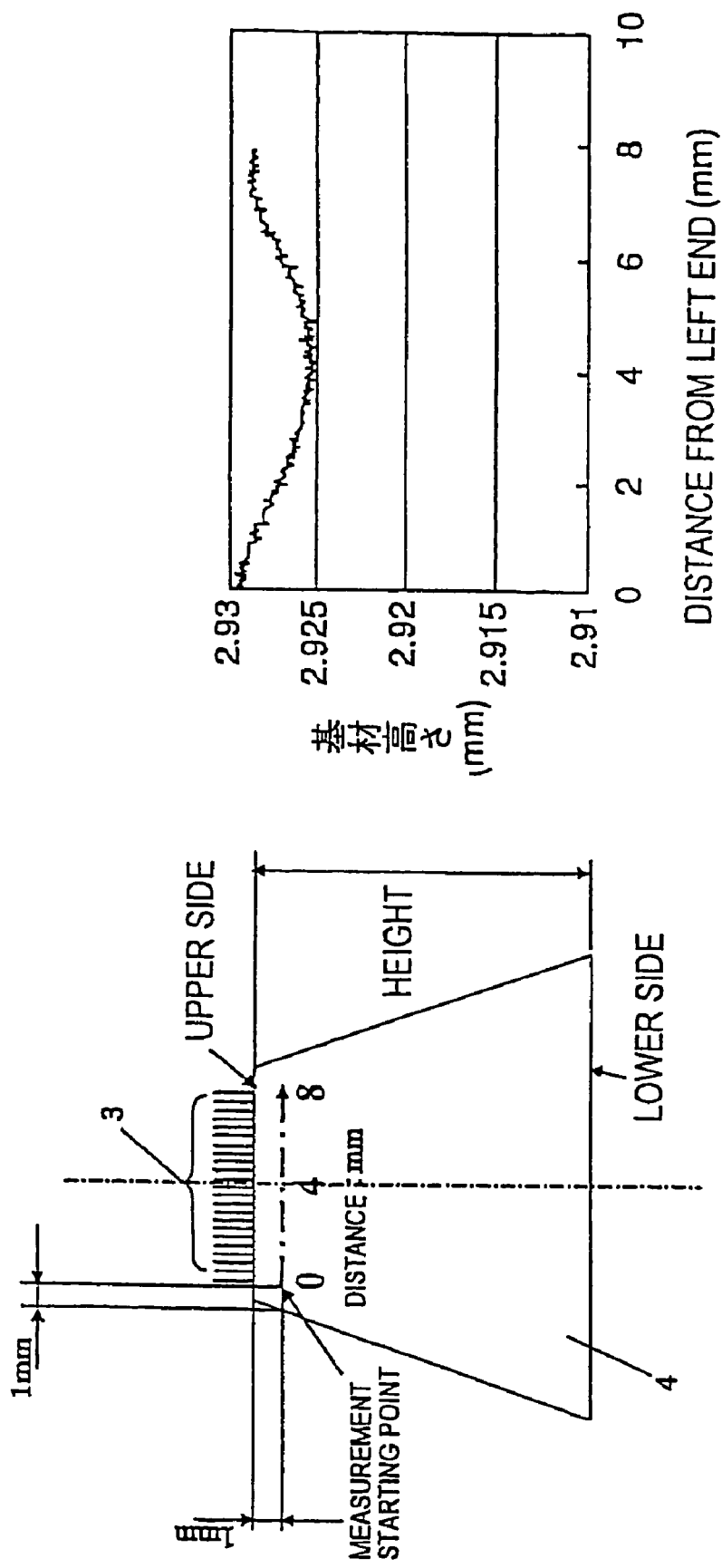
FIG. 12 is an illustration showing measured results of the warpage of a thin base member.

In order to readily bend the base member in a step of attaching a probe card unit to the backup plate and in order to prevent the base member from being cracked, the base member preferably has a thickness of 100 µm as described in the beginning of this embodiment. When the thickness of the base member is thinned to a proper value of about 100 micro µm, the base members can be readily bent without being cracked; however, there is a problem in that the base member is warped. FIG. 12 shows measured results of the warpage in the base member when the backup plate is attached to the probe card unit. The probe card unit used has trapezoidal sections (portions of the base member). The trapezoidal sections each has a side (upper side) from which the probe pins extend and which has a length of 10 mm, a lower side at which bending occurs and which has a length of 36 mm, and a height of 13 mm. The figure shows the change in the height of a sector of the base member, the height being determined with a non-contact laser measurement unit with reference to the protrusive surface of the backup plate. The sector thereof extends from a point on the base member toward the right end of the base member and has a length of 8 mm. The point is 1 mm apart from the boundary between the base member and the roots of the probe pins and also 1 mm apart from the left end of the base member and is represented by 0. The side of the base member has a region in which 400 probe pins are arranged and also has spaces which each extend from an end of the side and which have a length of 1 mm. The length of this region is determined as follows: 400×0.02 mm=8 mm. Therefore, the length of the side is equal to 10 mm in total. The 8 mm long region was measured except both 1 mm long spaces. In this figure, the abscissa represents the distance from the start point of measurement and the ordinate represents the height from the protrusive surface of the backup plate. It is clear that the base member is warped, that is, the center of the region (the point 4 mm apart from the left end of the region) is 5 µm lower than both ends of the region. When the base member has such warpage, the probe pins 3 have different heights. In order to achieve good contact properties, a large overdrive is necessary. This leads to an increase in bending stress applied to the roots of the probe pins, resulting in a reduction in the durability of the probe pins 3.

Figure 13:
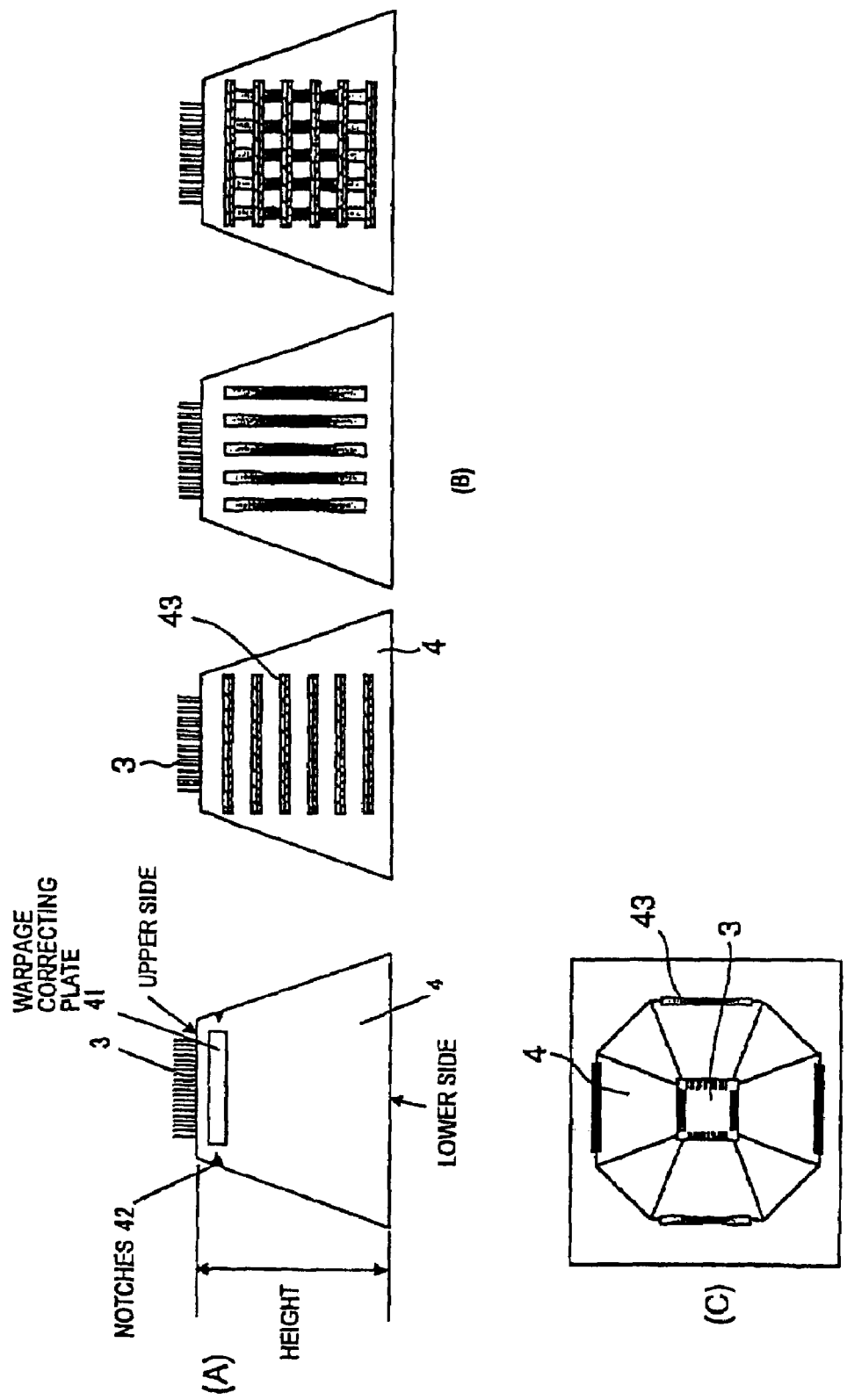
FIGS. 13(A), 13(B), and 13(C) are illustrations showing warpage-reducing means provided to the rear face of thin base member.

Therefore, measures, shown in FIG. 13, for reducing warpage are necessary. The measures are categorized into three types. FIGS. 13(A), 13(B), and 13(C) show portions of the rear face of the base member 4.

As shown in FIG. 13(A), the first measure provides a warpage-correcting plate 41 attached to the rear face of the base member 4 or notches 42 formed at an end face of the base member 4. Mounted positions of the warpage-correcting plate 41 and formed positions of the notches 42 are preferably located close to the probe pins 3 to the utmost.

As shown in FIG. 13(B), the second measure provides a plurality of notches 43, arranged in the rear face of the base member 4, having a depth insufficient to cause negative effects on wires placed on the main face of the base member 4. The notches may extend in the lateral direction, the longitudinal direction, or the lateral and longitudinal directions. The direction that the notches extend may be selected depending on the degree of warpage.

As shown in FIG. 13(C), the third measure provides another type of notches 43 formed at portions at which bending occurs and which have a depth insufficient to cause negative effects on the wires placed on the main face of the base member 4 after the rear face of the base member 4 has been ground.

If the base member 4 having the probe pins 3 and the wiring layers 5 is ground so as to have a small thickness, the base member can be prevented from being warped using any one of these measures. Inasmuch as the overdrive for achieving proper contact may be small, the probe pins 3 have long life.

As described above, the structure of the second embodiment of this invention have higher contact reliability and can be easily assembled as compared to the structure of the first embodiment of this invention. Furthermore, the accuracy of the backup plate 7 can be reduced, the cost can be reduced.

[Manufacturing Methods]

Figure 14:
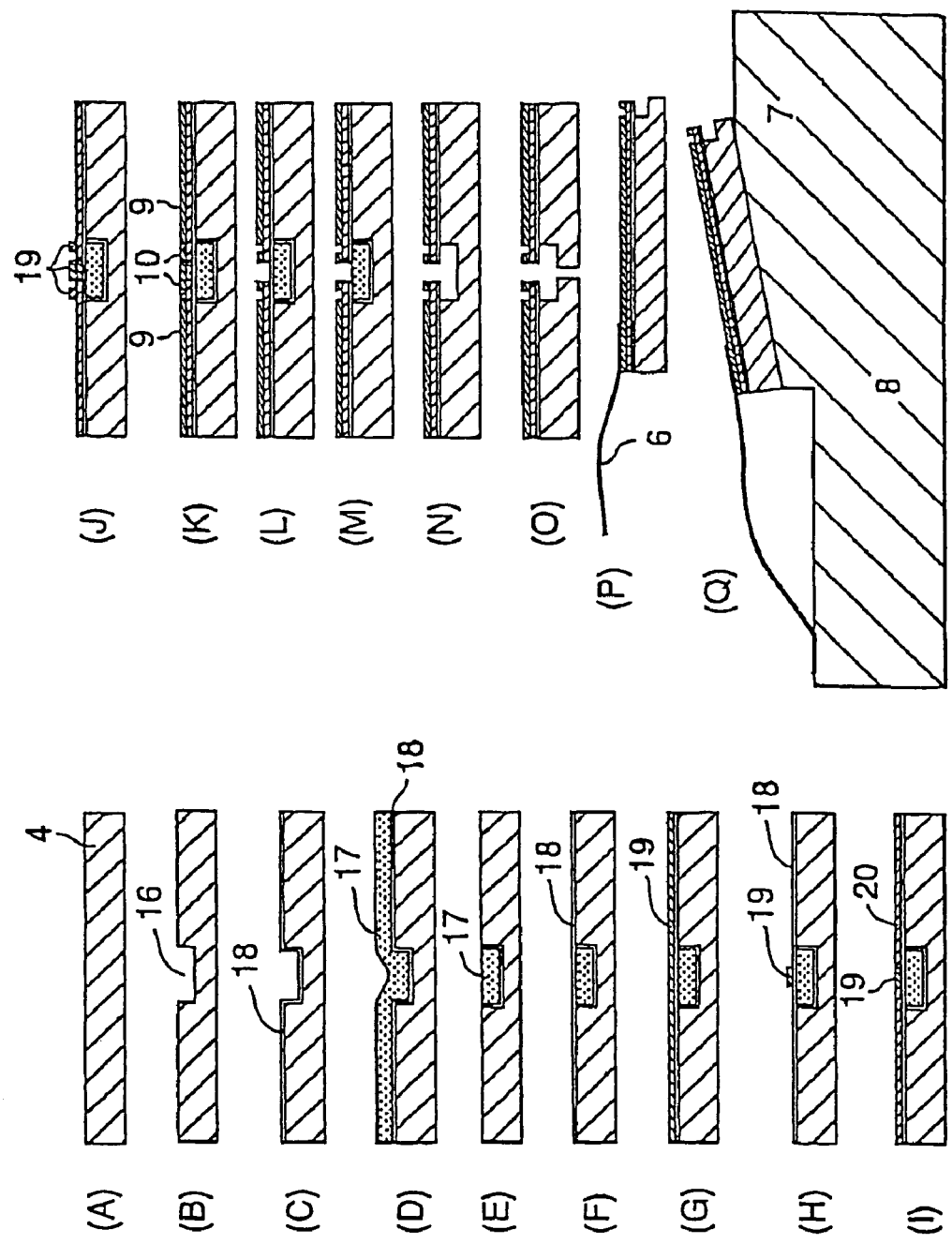
FIGS. 14(A) to 14(Q) are sectional views for use in describing steps of manufacturing the inspection probe of the first embodiment of this invention.
Figure 15:
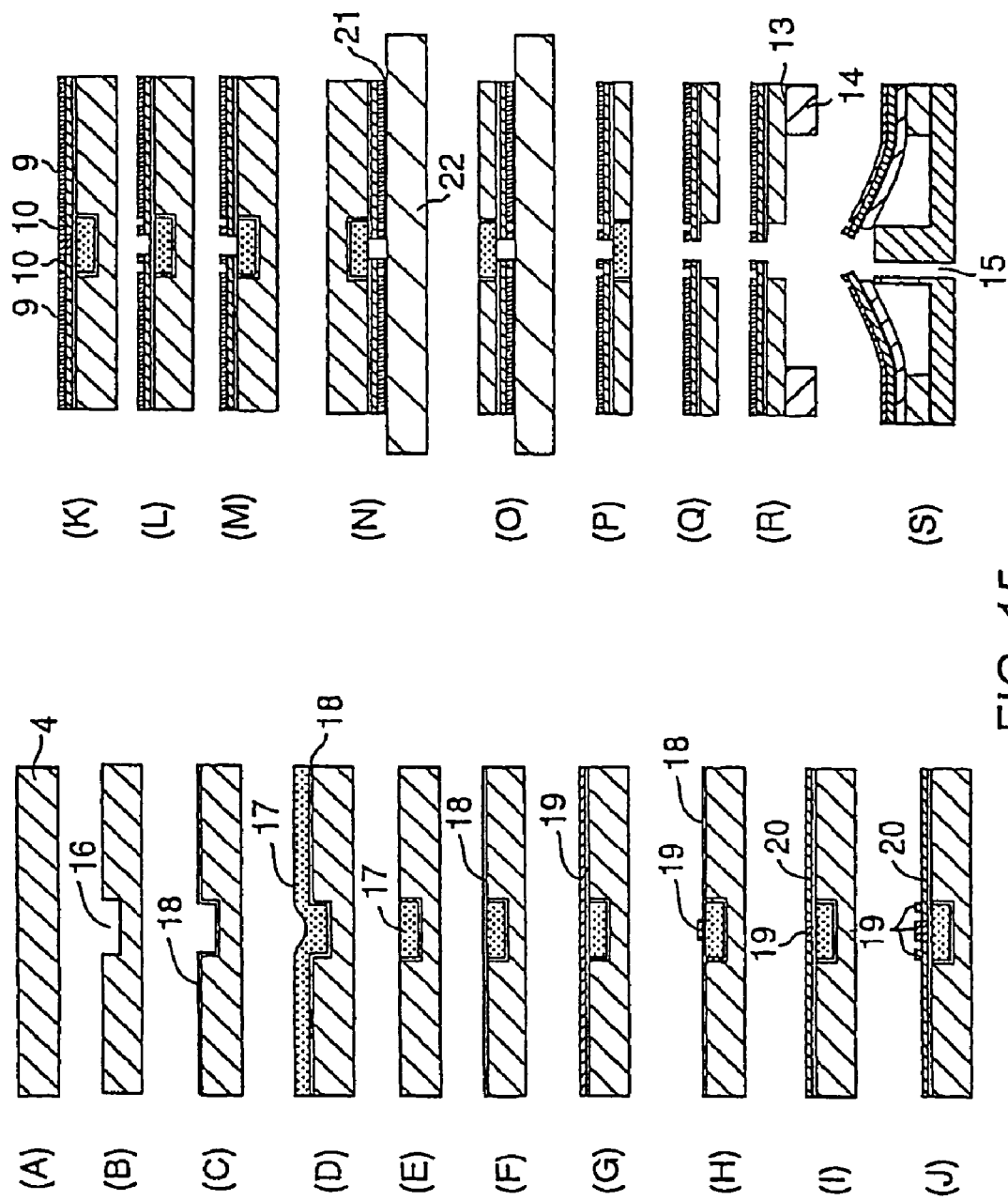
FIGS. 15(A) to 15(S) are sectional views for use in describing steps of manufacturing the inspection probe of the second embodiment.

Referring now to FIGS. 14 and 15, detailed description will proceed to a method for manufacturing the inspection probe structure according to the first embodiment of the present invention and a method for manufacturing the probe tip structure according to the second embodiment of the present invention. In this embodiment, the second arrangement shown in FIG. 5(B) will be described to be used as an example.

Referring now to FIG. 14, the description will proceed to a method for manufacturing the probe base members 4 having the probe pins 3 and the wiring layers 5 according to the first embodiment and a procedure for mounting the base members on the inspection substrate 8.

First, as shown in FIG. 14(A), the base members 4 each having a thickness of 500 μm or more are prepared so that the base members must have a sufficient strength after countersunk holes are provided in areas for forming the probe pins. In order to prevent the positional accuracy of the pins from being reduced due to the thermal history during the manufacture of the probe and in order to prevent the probe pins from being misaligned with the superconductor electrodes in a step of inspecting a wafer at high temperature, the following material is used: a material, such as glass ceramic, glass, or silicon, having a thermal expansion coefficient close to that of silicon widely used to manufacture semiconductor devices. Among these materials, the glass ceramic is preferably used in view of its processability and electrical properties. Next, as shown in FIG. 14(B), the countersunk holes 16 are provided in the areas, included in the base members 4, for forming the probe pins 3 with a grinder. In view of the accuracy of the grinder used in a shaping step, the countersunk holes are formed so as to have a depth of 150 μm or more. Subsequently, as shown in FIG. 14(C), seed layers 18 having a thickness of 0.3 μm are each formed on a main surface of the base members 4 and the countersunk holes 16 by a sputtering or deposition process. Thereafter, as shown in FIG. 14(D), metal layers (for example, copper) for forming sacrificial layers 17 are formed on the base members 4 by an electroplating process such that the surfaces of the sacrificial layers placed in the countersunk holes are higher than the main surface of the base members 4. The main surface of the probe base members 4 are plated with metal. As shown in FIG. 14(E), the sacrificial layers 17 are each provided in the corresponding countersunk holes 16 by polishing the metal layers after plating.

Next, as shown in FIG. 14(F), seed layers 18 having a thickness of about 0.3 μm are formed on faces at which the sacrificial layers 17 are exposed. Subsequently, as shown in FIG. 14(G), resists 19 having a thickness of about 20 μm are provided above the resulting faces by a coating or adhesion process. As shown in FIG. 14(H), portions of the resists 19 that correspond to the probe pins 3 and the wiring layers 5 are removed by exposure and then development. As shown in FIG. 14(I), metal layers 20 having elasticity are formed in the recessed regions by a plating process. Subsequently, as shown in FIG. 14(J), resists are provided on the metal layers 20, subjected to exposure, and then subjected to development, whereby recessed sections are formed close to the tips of the probe pins and formed on the wiring layers. Next, as shown in FIG. 14(K), the metal layers 10 having good contact properties are formed in the recessed sections located close to the tips thereof and the low-resistivity metal layers 9 are formed in the recessed sections on the wiring layers by a plating or sputtering process.

Thereafter, as shown in FIG. 14(L), the resists 19 are removed by a wet etching process such that the probe pins and the wiring layers remain. Next, as shown in FIG. 14(M), exposed portions of the seed layers 18 are removed by a milling process or another process. Finally, as shown in FIG. 14(N), the sacrificial layers 17 are removed by a wet etching process, whereby the probe pins are formed. As shown in FIG. 14(O), the base members 4 are cut so as to have a predetermined shape, whereby the base members 4 having the probe pins 3 and the wiring layers 5 thereon can be obtained. Subsequently, as shown in FIG. 14(P), the FPCs 6 or TCPs are connected to external terminals placed on end portions of the wiring layers on the base members 4 by a thermocompression bonding process using ACFs. As shown in FIG. 14(Q), the base members are attached to the backup plate 7 placed on the inspection substrate 8.

The contact angle of the probe pins 3 with respect to the electrodes 2 of the semiconductor device 1 depends on the inclination angle of the backup plate 7. Therefore, the backup plate 7 must be prepared with extremely high accuracy; hence, high skills are necessary for the assembly thereof. The inspection substrate 8 is finally connected to other terminals of the FPCs 6 or the TCPs with ACFs or the like.

Referring now to FIG. 15, the description will proceed to a method for manufacturing the probe base member 4 having the probe pins 3 and the wiring layers 5 according to the second embodiment of this invention.

First, as shown in FIG. 15(A), the base member 4 is prepared so as to have a thickness of 500 μm or more. The base member 4 is made of, for example, ceramic, glass ceramic, glass, or silicon. Next, as shown in FIG. 15(B), a countersunk hole 16 with a depth of 150 μm or more is provided in an area, included in the base member 4, for forming the probe pins 3 with a grinder. Subsequently, as shown in FIGS. 15(C) to 15(E), a metal layer (for example, copper) for forming a sacrificial layer 17 is formed by a plating process such that the sacrificial layer 17 is filled in the countersunk hole 16.

Next, as shown in FIG. 15(F), a seed layer 18 with a thickness of 0.3 μm is formed on a face at which the sacrificial layer 17 exposed. As shown in FIG. 15(G), a resist 19 with a thickness of about 20 μm is provided above the resulting face by a coating or adhesion process. As shown in FIG. 15(H), portions of the resist 19 that correspond to the probe pins 3 or the wiring layers 5 are removed by exposure and then development, whereby a resist pattern is formed. Subsequently, as shown in FIG. 15(I), metal layers 20 having elasticity are formed in the recessed regions by a plating process. As shown in FIG. 15(J), resists are formed, subjected to exposure, and then subjected to development, whereby recessed sections are formed close to the tips of the probe pins and formed on pitch-expanded wires.

Subsequently, as shown in FIG. 15(K), the metal layers 10 having good contact properties are formed in the recessed sections located close to the tips thereof and the low-resistivity metal layers 9 are formed in the recessed sections on the wiring layers by a plating or sputtering process.

Alternatively, the following procedure may be used: recessed sections are formed close to the tips of the probe pins, the metal layers 10 having good contact properties are formed in these recessed sections by a plating or sputtering process, recessed sections are formed on the pitch-expanded wires, and the low-resistivity metal layers 9 are then formed in these recessed sections by a plating or sputtering process.

Thereafter, as shown in FIGS. 15(L) and 15(M), the resist 19 and then the seed layer 18, respectively, are partly removed by a wet etching process. These steps are the same as those described in the first embodiment of this invention.

Subsequently, as shown in FIG. 15(N), the face having the probe pins 3 and the wiring layers 5 are joined to a flat face of a platen 22 with wax 21 or an adhesive member. Subsequently, as shown in FIG. 15(O), the rear face of the base member 4 is ground such that the base member 4 has a thickness of, for example, 150 μm or less and the sacrificial layer 17 is exposed at the rear face thereof. Thereafter, as shown in FIG. 15(P), the base member is removed from the platen 22.

As shown in FIG. 15(Q), the sacrificial layer 17 is removed. Thereafter, as shown in FIG. 15(R), the base member 4 having the probe pins 3 and the wiring layers 5 is joined to the support substrate 14 having a thickness of 500 μm or more and the same size as that of the base member 4 with the adhesive member 13. The support substrate 14 has a perforation formed by removing a region inside an area at which bending occurs. Before the base member 4 is attached to the inspection substrate 8, as shown in FIG. 15(S), the three measures described in the second embodiment are provided to the base member 4 if the ground base member having the probe and the wiring layers have a thickness of 100 μm or less.

The notches 41 and the notches 43 are formed in the base member with a dicing saw or a laser unit after the rear face of the base member 4 is ground. The warpage-correcting plates 41 made of the same material as a material for forming the base member 4 are cut so as to have the same size as that of the base member 4 and then joined to the rear face of the base member with an adhesive member.

As described above, a probe pin structure of the present invention includes probe pins which include, as cores, metal layers having elasticity and of which the tips have been optimized depending on a material for forming electrodes of a semiconductor device; a base member having wiring layers; a flexible substrate having wiring layers connected to an inspection substrate with wires; and a backup plate, placed at a center area of the inspection substrate, having the base member that is placed thereon so as to adjust the contact angle of the probe pins with electrodes of a semiconductor device. The probe pins each have respective faces coming in contact with the electrodes of the semiconductor device and have respective layers, made of a material selected depending on the electrode material, having good contact properties. The structure further includes low-resistivity metal layers, placed on the wiring layers on the base member, for expanding the pitch of the electrodes. The material layers having good contact properties are spaced from the low-resistivity metal layers. According to such a configuration, the inspection probe can be electrically connected to electrodes of semiconductor devices securely and has durability sufficient for practical use. Furthermore, the base members having the wiring layers and the probe pins arranged at four sides are prepared in one step and the inspection probe has a configuration in which the base member is mounted on the inspection substrate comprising the protrusive backup plate having a perforation; hence, high contact reliability can be achieved.

The invention claimed is:

1. An inspection probe for inspecting electrical properties of a semiconductor device, comprising:
    a base member;
    wiring layers mounted on the base member;
    probe pins having tips, electrically connected to the wiring layers, protruding from the base member;
    first metal layers provided to the tips of the probe pins;
    second metal layers formed on the wiring layers, the second metal layers being made of a material different from that of the probe pins, the second metal layers physically separated from the first metal layers by the probe pins;
    a flexible, electrically connectable wiring substrate placed between the base member and a inspection substrate and a backup plate mounted on the inspection substrate, for mounting the base member thereon if the electrodes of the semiconductor device are arranged at sides thereof, correspond to multiple pins, and must be connected to the inspection substrate; and
    a support substrate which is integrated with peripheral portions of the base member with an adhesive member placed therebetween and which is made of the same material as a material of the base member, said support substrate being mounted on the inspection substrate, wherein the backup plate has a protrusive portion at a center area thereof such that the probe pins form a predetermined angle with respect to the electrodes of the semiconductor device.

2. The inspection probe according to claim 1, wherein the backup plate and the inspection substrate each has a perforations partly.

3. The inspection probe according to claim 1, wherein the base member has warpage-reducing means for reducing the warpage thereof.

4. The inspection probe according to claim 3, wherein the warpage-reducing means include a warpage-correcting plate attached to the rear face of the base member.

5. The inspection probe according to claim 3, wherein the warpage-reducing means include notches formed at end faces of the base member.

6. The inspection probe according to claim 3, wherein the warpage-reducing means include notches formed at edges of the base member at which bending occurs.

7. The inspection probe according to claim 3, wherein the warpage-reducing means include a plurality of notches, formed in the rear face of the base member, having a depth insufficient to cause negative effects on the main surface of the base member and wires.

8. The inspection probe according to claim 7, wherein the plurality of notches extend laterally.

9. The inspection probe according to claim 7, wherein the plurality of notches extend longitudinally.

10. The inspection probe according to claim 7, wherein the plurality of notches extend laterally and longitudinally.

* * * * *